United States Patent
Ye et al.

(10) Patent No.: US 10,504,875 B2
(45) Date of Patent: Dec. 10, 2019

(54) DIE-BONDING SUBSTRATE, HIGH-DENSITY INTEGRATED COB WHITE LIGHT SOURCE AND METHOD FOR MANUFACTURING THE SAME

(71) Applicant: FUJIAN CAS-CERAMIC OPTOELECTRONICS TECHNOLOGY CO., LTD, Fuzhou, Fujian (CN)

(72) Inventors: Shanghui Ye, Fujian (CN); Jieqin Zhang, Fujian (CN); Maochun Hong, Fujian (CN); Wenxiong Lin, Fujian (CN); Wang Guo, Fujian (CN); Yunfeng Zhang, Fujian (CN)

(73) Assignee: FUJIAN CAS-CERAMIC OPTOELECTRONICS TECHNOLOGY CO., LTD, Fuzhou, Fujian (CN)

(*) Notice: Subject to any disclaimer, the term of this patent is extended or adjusted under 35 U.S.C. 154(b) by 0 days.

(21) Appl. No.: 15/777,582

(22) PCT Filed: Jun. 8, 2016

(86) PCT No.: PCT/CN2016/085371
§ 371 (c)(1),
(2) Date: May 18, 2018

(87) PCT Pub. No.: WO2017/084320
PCT Pub. Date: May 26, 2017

(65) Prior Publication Data
US 2018/0315739 A1   Nov. 1, 2018

(30) Foreign Application Priority Data

Nov. 20, 2015 (CN) .......................... 2015 1 0806034

(51) Int. Cl.
*H01L 25/075* (2006.01)
*H01L 33/62* (2010.01)
(Continued)

(52) U.S. Cl.
CPC .......... *H01L 25/0753* (2013.01); *H01L 33/62* (2013.01); *H01L 33/505* (2013.01);
(Continued)

(58) Field of Classification Search
None
See application file for complete search history.

(56) References Cited

U.S. PATENT DOCUMENTS

2006/0284195 A1* 12/2006 Nagai ..................... F21K 9/00
257/98
2011/0180817 A1* 7/2011 Ishizaki ................... F21V 3/00
257/88

FOREIGN PATENT DOCUMENTS

CN          202855798 U     4/2013
CN          103199087 A     7/2013
(Continued)

*Primary Examiner* — Herve-Louis Y Assouman
(74) *Attorney, Agent, or Firm* — Novick, Kim & Lee, PLLC; Allen Xue

(57) ABSTRACT

A die-bonding substrate has a substrate, and a conductive line layer and a chip array provided on the substrate. The conductive line layer includes a chip welding wire region and an external electrode region connected with each other. The chip welding wire region is composed of multiple conductive lines, wherein the central conductive line located in the central position of the chip welding wire region is a straight line section. The conductive lines arranged at both sides of the central conductive line are straight line sections at both ends, and arc sections curved outwards in the middle, so that the entire chip welding wire region forms a circular area. The array chips are arranged inside the circular area, and are electrically connected with the conductive lines (Continued)

arranged at both sides. The entire chip welding wire region can also form a rectangular area.

14 Claims, 3 Drawing Sheets

(51) Int. Cl.
*H01L 33/64* (2010.01)
*H01L 33/56* (2010.01)
*H01L 33/50* (2010.01)
*H01L 33/60* (2010.01)

(52) U.S. Cl.
CPC .............. *H01L 33/56* (2013.01); *H01L 33/60* (2013.01); *H01L 33/647* (2013.01); *H01L 2224/4809* (2013.01); *H01L 2933/005* (2013.01); *H01L 2933/0066* (2013.01); *H01L 2933/0091* (2013.01)

(56) References Cited

FOREIGN PATENT DOCUMENTS

| CN | 205104516 U | 3/2016 |
|----|-------------|--------|
| JP | 2007142017 A | 6/2007 |

* cited by examiner

DIE-BONDING SUBSTRATE, HIGH-DENSITY INTEGRATED COB WHITE LIGHT SOURCE AND METHOD FOR MANUFACTURING THE SAME

TECHNICAL FIELD

The present invention relates to a white light source, in particular to a die-bonding substrate, a high-density integrated COB white light source, and a method for manufacturing the same.

BACKGROUND ART

By virtue of the high efficiency and the power-saving performance, LED illumination exhibits economic benefits, such as notable consumption reduction, energy saving, etc., and therefore has been vigorously promoted and widely applied in many illumination fields and other industries in recent years. At the current level of industrial technology, the technique of LED monochromatic chip added with phosphor is still the dominant fashion to achieve a white-light LED. The most common encapsulation form is excitation chips coated with fluorescent powder gel. The poor thermally conducting performance of fluorescent gel, and the directly contacting with the excitation chips that emitting light and heat, easily lead to thermal aging of the coated fluorescent powder gel, which affects the light quality and operation stability of the white light source.

In terms of illumination popularization and application, the white-light LED still has an essential drawback of low luminous flux. As an illuminating light source, it must emit more light and achieve a higher utilization efficiency of energy. Obviously, the power of a single chip is unable to meet the requirements of the illumination field on high brightness and high power. Since large-power LED modules are developed with the tendency of high integration and volume miniaturization, it is necessary to look for the technology for large-power and highly integrated white-light LED, in order to achieve the luminous flux required for general illumination.

CONTENTS OF THE INVENTION

In order to solve the aforementioned technical problems, the present invention proposes a die-bonding substrate, a high-density integrated COB white light source and a method for manufacturing the same. With an optimized configuration of the array chips on the die-bonding substrate and an optimized layout and division of the conductive line layer, the present invention guarantees the drainage of heat flow of the chips that emitting light and heat, ensures the uniformity of the radiation lights excited by the chips, and realizes a high-density integration and a high-power encapsulation of the light source.

The technical solutions proposed by the present invention are as follows:

(1) A die-bonding substrate, comprising a substrate, and a conductive line layer and array chips provided on the substrate, wherein the conductive line layer includes a chip welding wire region and an external electrode region, which are electrically connected to each other; the chip welding wire region is composed of multiple conductive lines;

wherein the central conductive line located in the central position of the chip welding wire region is a straight line section, and is the longest line section; the conductive lines arranged at both sides of the central conductive line are straight line sections at both ends, and arc sections curved outwards in the middle, the farther a conductive line lies away from the central conductive line, the shorter its straight line section is, and the longer its arc section is, so that the entire chip welding wire region forms a circular area; the array chips are arranged inside the circular area, and are electrically connected with the conductive lines arranged at both sides;

or wherein the conductive lines are straight line sections arranged parallel to one another, so that the entire chip welding wire region forms a rectangular area; the array chips are arranged inside the rectangular area, and are electrically connected with the conductive lines arranged at both sides.

(2) On the basis of the technical solution (1), the circular area is equally divided into four sector areas, two symmetrically distributed areas of arc sections and two symmetrically distributed areas of straight line sections.

(3) On the basis of the technical solution (1), the series-parallel logic of the array chips is to be connected at first in parallel and then in series.

(4) On the basis of the technical solution (1), the array chips are electrically connected to the conductive lines in the specific manner: the LED chips in the array chips are electrically connected to the corresponding conductive lines in the conductive line layer by means of a reverse looping and wire bonding process and a gold wire welding process.

(5) A high-density integrated COB white light source, wherein the light source comprises the die-bonding substrate and the solid-state phosphor according to any one of the technical solutions (1) to (4), and a solid-state phosphor located in the light exit direction of the die-bonding substrate.

(6) On the basis of the technical solution (5), the light source further comprises a height-limiting retainer, which is provided on the die-bonding substrate for supporting the solid-state phosphor.

(7) On the basis of the technical solution (6), the height-limiting retainer is 150-350 microns higher than the die-bonding substrate.

(8) On the basis of the technical solution (6), the light source further comprises a reflective dam body made of highly reflecting colloid, wherein the reflective dam body is arranged on the die-bonding substrate at the outer edge of the height-limiting retainers and its height is not less than that of the height-limiting retainers.

(9) On the basis of the technical solution (8), the highly reflecting colloid reflects the radiation lights in the range of 200-1000 nm with a reflectivity of not less than 70%.

(10) On the basis of the technical solution (8), the outer diameter of the solid-state phosphor is not larger than the inner diameter of the reflective dam body.

(11) On the basis of the technical solution (5), the host material of the solid-state phosphor is glass, ceramic, glass-ceramic or heat-resistant hard organism, and the solid-state phosphor has a function of wavelength conversion, being able to absorb excitation lights having a wavelength of 200-600 nm and emit radiation lights having a wavelength of 400-800 nm.

(12) A method for manufacturing a high-density integrated COB white light source, comprising the steps of: manufacturing a die-bonding substrate, manufacturing height-limiting retainers, electrically connecting welding wires, manufacturing a reflective dam body, pre-curing a filled colloid, encapsulating a solid-state phosphor;

the manufacturing of a die-bonding substrate comprising:

11) designing the configuration of the conductive line layer and the array chips; the conductive line layer including a chip welding wire region and an external electrode region, which are electrically connected to each other; the chip welding wire region being composed of multiple conductive lines; wherein the central conductive line located in the central position of the chip welding wire region is a straight line section, and is the longest line section; the conductive lines arranged at both sides of the central conductive line are straight line sections at both ends, and arc sections curved outwards in the middle, the farther a conductive line lies away from the central conductive line, the shorter its straight line section is, and the longer its arc section is, so that the entire chip welding wire region forms a circular area, which is equally divided into four sector areas, two symmetrically distributed areas of arc sections and two symmetrically distributed areas of straight line sections; or wherein the conductive lines are straight line sections arranged parallel to one another, so that the entire chip welding wire region forms a rectangular area;

12) fabricating the conductive line layer on a heat-sink substrate by printing process, and at the same time, covering the regions except the conductive line layer with an electrically insulating layer;

13) fixing the array chips in the circular or rectangular area by a die-bonding process, so as to form a die-bonding substrate;

manufacturing height-limiting retainers is to manufacture height-limiting retainers at the periphery of the die-bonding region;

electrically connecting welding wires is to electrically connect the LED chips in the array chips to the corresponding conductive lines in the conductive line layer by means of a reverse looping and wire bonding process and a gold wire welding process;

manufacturing a reflective dam body is to manufacture a reflective dam body at the periphery of the height-limiting retainers;

pre-curing a filled colloid is to fill a space enclosed by the reflective dam body with transparent colloid until the height-limiting retainers are submerged, to discharge gases and perform pre-curing after leveling of the colloid;

encapsulating a solid-state phosphor is to place the solid-state phosphor on the height-limiting retainers inside the reflective dam body, to maintain a light-pressure state and perform a subsequent deep thermal curing.

(13) On the basis of the technical solution (12), during the reverse looping and wire bonding and during the gold wire welding, the first welding point is a conductive line, the second welding point is an electrode of an LED chip, and is welded by ball welding, the highest point of the bank of the wire bonding is 20-80 microns higher than the LED chips, but not higher than the height-limiting retainers, the angle between the lead wire of the first welding point and the horizontal direction is in the range of 15°-80°, and the angle between the lead wire of the second welding point and the horizontal direction is in the range of 30°-80°.

(14) On the basis of the technical solution (12), the pre-curing is performed at a temperature of 60° C. for 0.5 hour, the deep thermal curing is performed firstly at a temperature of 80° C. for 0.5 hour, then at a temperature of 150° C. for 1 hour, and finally at a temperature of 60° C. for 0.5 hour.

(15) On the basis of the technical solution (12), the outer diameter of the solid-state phosphor is not larger than the inner diameter of the reflective dam body.

(16) On the basis of the technical solution (12), the host material of the solid-state phosphor is glass, ceramic, glass-ceramic or heat-resistant hard organism, and the solid-state phosphor has a function of wavelength conversion, being able to absorb excitation lights having a wavelength of 200-600 nm and emit radiation lights having a wavelength of 400-800 nm.

The advantageous effects of the present invention are as follows:

1. Through an optimized configuration of the array chips on the die-bonding substrate and an optimized layout and division of the conductive line layer, the drainage of heat flow of the chips that emitting light and heat is guaranteed, the uniformity of the radiation lights excited by the chips is ensured, and a high-density integration and a high-power encapsulation of the light source is realized.

2. Through the arrangement of the reflective dam body, and the optimization of the wire bonding process, the effective light output is increased. The encapsulated light source is characterized by a high luminous flux, a high luminous efficiency and a low cost.

3. By improving the wire-welding manner, the present invention reduces the distance of the heat conduction from the fluorescent ceramic sheet to the heat dissipation system, thereby reducing the temperature of the fluorescent ceramic and improving its reliability and luminous efficiency.

DESCRIPTION OF THE DRAWINGS

The present invention will be further described with reference to the accompanying drawings in combination with the embodiments.

DETAILED DESCRIPTION OF THE INVENTION

Figure 1A:
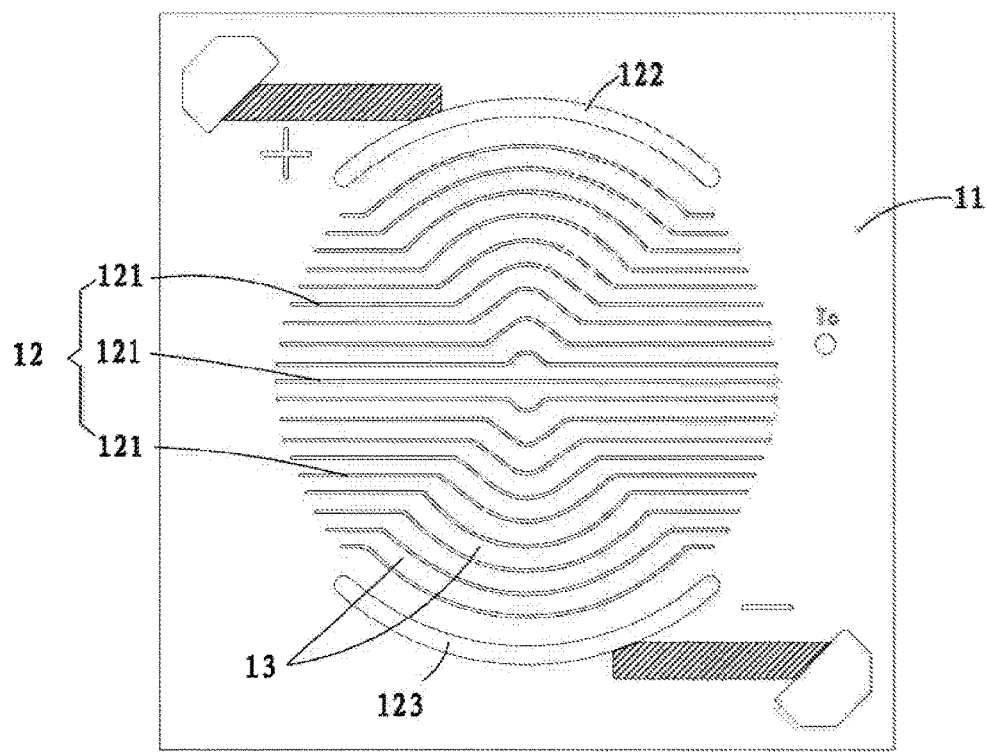
FIG. 1a is a schematic front view of the structure of a die-bonding substrate in the high-density integrated COB white light source according to the present invention.

In order to make the objective, the technical solutions and the advantage of the present invention more intelligible, the present invention will be described in greater detail in combination with the embodiments with reference to the accompanying drawings. It is to be understood by those skilled in the art that the present invention is not limited to the drawings and the following embodiments.

As shown in FIGS. 1 to 4, the high-density integrated COB white light source according to the present invention includes a die-bonding substrate 1 and a solid-state phosphor 2, and it further includes height-limiting retainers 3 and a reflective dam body 4. The solid-state phosphor 2 is located right ahead of the die-bonding substrate 1, the height-limiting retainers 3 are provided on the die-bonding substrate 1 for supporting the solid-state phosphor 2, and they are 150-350 microns higher than the die-bonding substrate 1. The reflective dam body 4 is made of a highly reflecting colloid, and it is arranged on the die-bonding substrate 1 at the outer edge of the height-limiting retainers 3, and its height is not less than that of the height-limiting retainers 3, the highly reflecting colloid reflects the radiation lights in the range of 200-1000 nm with a reflectivity of not less than 70%.

The die-bonding substrate 1 includes a heat-sink substrate 11, and a conductive line layer 12, insulating layers 13, and array chips 14 provided on the heat-sink substrate 11.

Figure 1B:
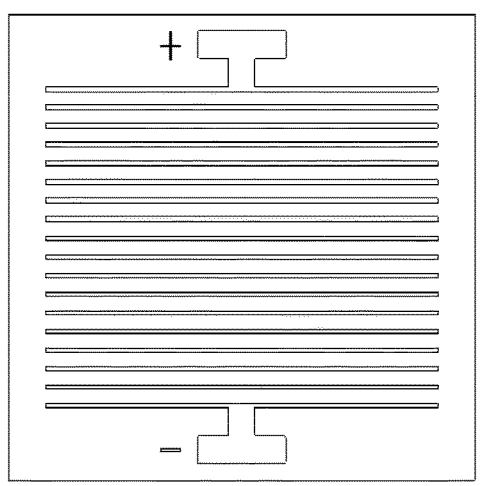
FIG. 1b is a schematic front view of the structure of a die-bonding substrate of another shape in the high-density integrated COB white light source according to the present invention.

The conductive line layer 12 includes a chip welding wire region and an external electrode region, which are electrically connected to each other; the chip welding wire region is composed of multiple conductive lines 121; the external electrode region is divided into a positive electrode region 122 and a negative electrode region 123, which are provided at the two ends of the chip welding wire region, wherein the central conductive line located in the central position of the chip welding wire region is the longest and is a straight line; the conductive lines arranged at both sides of the central conductive line are straight line sections at both ends, and arc sections curved outwards in the middle, the farther a conductive line lies away from the central conductive line, the shorter its straight line section is, and the longer its arc section is; so that the entire chip welding wire region forms a circular area, as shown in FIG. 1a, the circular area is equally divided into four sector areas, two symmetrically distributed areas of arc sections and two symmetrically distributed areas of straight line sections. The entire chip welding wire region is not limited to circular a shape, but can be a variety of shapes, such as a rectangular or rhombic shape, etc. When the entire chip welding wire region is rectangular, such as quadrilateral, as shown in FIG. 1b, the conductive lines are straight line sections arranged parallel to one another, so that the entire chip welding wire region forms a rectangular area; the array chips are arranged inside the rectangular area and are electrically connected with the conductive lines arranged at both sides.

The adoption of a circular arrangement further has the following advantages: the light-emitting surface is circular, which meets the requirements of a symmetrical optical system on the light source, and makes it more convenient to design a secondary optical system. The adoption of a quadrilateral arrangement further has the following advantages: since the chips are quadrilateral, a quadrilateral or another rectangular arrangement makes it possible to arrange as many chips as possible within a limited area, making the brightness (luminous flux/area) of the light source stronger.

The array chips 14 are arranged inside the circular area, and are electrically connected with the conductive lines 121 arranged at both sides.

As shown in FIGS. 1 to 4, the method for manufacturing a high-density integrated COB white light source according to the present invention comprises the steps of: manufacturing a die-bonding substrate, manufacturing height-limiting retainers, electrically connecting welding wires, manufacturing a reflective dam body, pre-curing a filled colloid, and encapsulating a solid-state phosphor.

Figure 2:
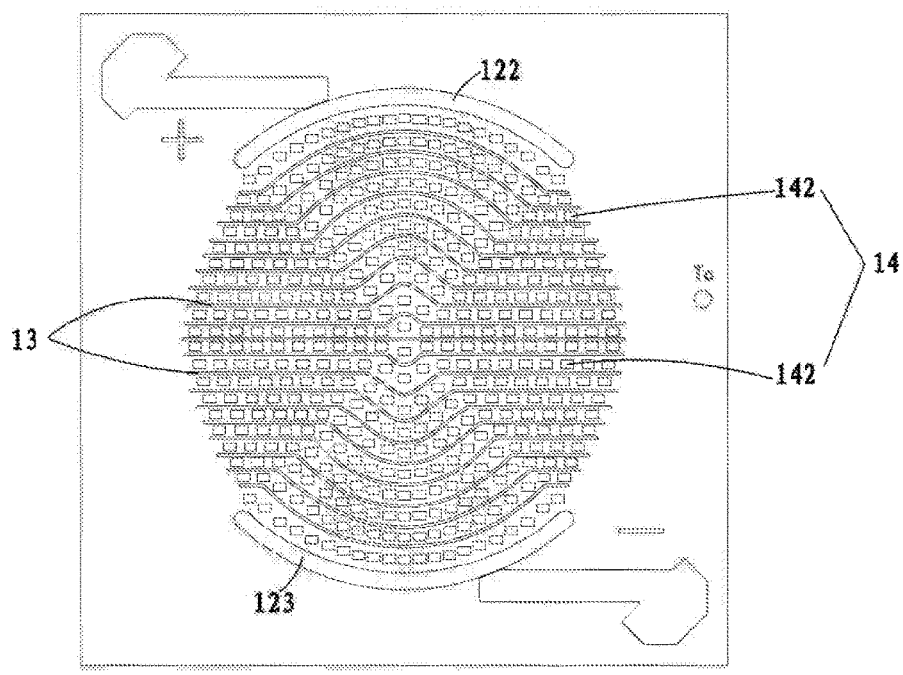
FIG. 2 is a schematic structural diagram of the distribution of the array chips in the high-density integrated COB white light source according to the present invention.

As shown in FIGS. 1a and 1b, manufacturing a die-bonding substrate 1 comprises:

11) designing the configuration of the conductive line layer 12 and the array chips 14; the conductive line layer 12 including a chip welding wire region and an external electrode region, which are electrically connected with each other; the chip welding wire region being composed of multiple conductive lines 121; the external electrode region being divided into a positive electrode region 122 and a negative electrode region 123, which are provided at the two ends of the chip welding wire region;

wherein the central conductive line located in the central position of the chip welding wire region is the longest and is a straight line; the conductive lines arranged at both sides of the central conductive line are straight line sections at both ends, and arc sections curved outwards in the middle, the farther a conductive line lies away from the central conductive line, the shorter its straight line section is, and the longer its arc section is; so that the entire chip welding wire region forms a circular area, which is equally divided into four sector areas, two symmetrically distributed areas of arc sections and two symmetrically distributed areas of straight line sections;

or wherein the conductive lines are straight line sections arranged parallel to one another, so that the entire chip welding wire region forms a rectangular area; the array chips are arranged inside the rectangular area, and are electrically connected with the conductive lines arranged at both sides;

12) fabricating the conductive line layer 12 on the heat-sink substrate 11 by a printing process, and at the same time, covering the regions except the conductive line layer 12 with an electrically insulating layer 13; in a specific embodiment, a substrate made of 99% aluminium oxide ceramic is used as the heat-sink substrate 11, and silvered lines with a thickness of circa 15 μm are printed on the substrate made of aluminium oxide ceramic by using printing process, so as to fabricate the conductive line layer 12, and insulating glass is printed on the circuit which does not have a welding function, in order to provide protection, thereby forming an electrically insulating layer 13;

13) as shown in FIG. 2, the array chips 14 are fixed in the circular or rectangular area by a die-bonding process, for example, the LED chips 142 may be fixed on the insulating layer 13 between two adjacent conductive lines 121, so as to form a die-bonding substrate 1; in the specific embodiment, medium-power blue-light chips are selected as the LED chips 142, an insulating die-bonding gel with a high-thermal conductivity is used to fix the LED chips 142 on the substrate with a designed chip configuration, the selected die-bonding gel is preferably an insulating glue having a high thermal conductivity and a high reflectivity, the distribution of the conductive line layer 12 on the die-bonding substrate 1 should ensure a uniform distribution of the LED chips 142, so as to make the illumination of the lights radiated on the fluorescent ceramic sheet uniform, in the specific embodiment, the series-parallel logic of the LED chips 142 is to be connected at first in parallel and then in series, which greatly improves the overall reliability and the impact-resisting performance of the COB light source.

Figure 3:
FIG. 3 is a schematic side view of the structure of the high-density integrated COB white light source according to the present invention.

As shown in FIG. 3, manufacturing height-limiting retainers 3 is to manufacture height-limiting retainers 3 at the periphery of the die-bonding region, i.e. of the circular or rectangular area; in the specific implementation, a plurality of sapphire crystals can be fixed as stationary height-limiting means for limiting the height.

Figure 4:
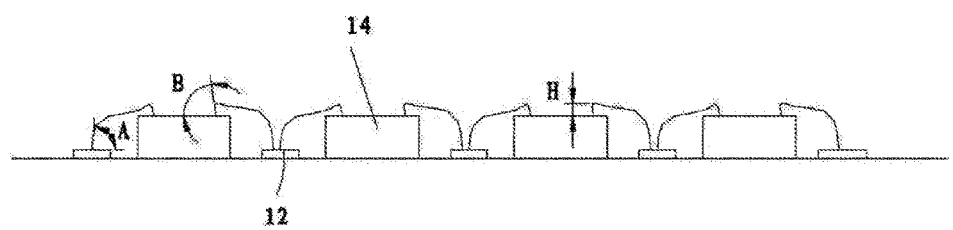
FIG. 4 is a partial enlarged view of FIG. 3, mainly showing the structure of the welding wires of the chips.

As shown in FIG. 4, electrically connecting welding wires is to electrically connect the LED chips 142 in the array chips 14 to the corresponding conductive lines 121 in the conductive line layer 12 by means of a reverse looping and wire bonding process and a gold wire welding process; wherein during the reverse looping and wire bonding and during the gold wire welding, the first welding point is a conductive line 121, the second welding point is an electrode of the LED chips 142, and the second welding point is welded by ball welding, in order to prevent electrical leakage, it shall be higher than the chips by at least the height of one gold ball, which is about 1 mil, the highest point of the bank of the wire bonding is higher than the LED chips 142 by a height of H=20-80 microns, but not higher than the height-limiting retainers 3, the angle A between the lead wire of the first welding point and the horizontal direction is in the range of 15°-80°, and the angle B between the lead wire of the second welding point and the horizontal direction is in the range of 30°-80°. Compared to a conventional encapsulation in which the height of the line width of the welding wire lies in the range of 120 um-250 um, the thermal state condition of the array chips can be greatly improved by virtue of the wire bonding process of the present invention.

Manufacturing a reflective dam body 4 is to manufacture a reflective dam body 4 at the periphery of the height-limiting retainers 3 with a height not less than that of the height-limiting retainers 3; in the specific implementation, a dam-encircling gel is used, a circle of dam-encircling gel is applied around the central point of the die-bonding region as the center, and is dried and formed into a reflective dam body 4, a rectangular area can be achieved in the same way. The dam-encircling gel is a highly reflecting colloid, and the highly reflecting colloid reflects the radiation lights in the range of 200-1000 nm with a reflectivity of not less than 70%.

Pre-curing a filled colloid is to fill a space enclosed by the reflective dam body 4 with transparent colloid until the height-limiting retainers 3 are submerged, and to discharge gases and perform pre-curing after leveling of the colloid; the pre-curing is performed at a temperature of 60° C. for a duration of 0.5 hour; wherein the transparent colloid can be organic silica gel with an amount that is circa 20 microns higher than the retaining chips after the leveling, the gel is heated at the temperature of 60° C. for 0.5 hour, so as to become flowable to present a horizontal level, so that as many bubbles can be discharged as possible.

Encapsulating a solid-state phosphor 2 is to place the solid-state phosphor 2 on the height-limiting retainers 3 inside the reflective dam body 4, to maintain a light-pressure state and perform a subsequent deep thermal curing. The deep thermal curing is performed firstly at a temperature of 80° C. for 0.5 hour; then at a temperature of 150° C. for 1 hour; and finally at a temperature of 60° C. for 0.5 hour.

Light sources fabricated in the embodiments specified above, at a luminous flux of not less than 15,000 lumens, exhibit a luminous efficiency of not less than 140 lm/W, and the temperature at the welding spot of the light source module is reduced by approximately 40° C., the maximum area of the excitation chips may account for 75% of the area of the die-bonding region. Compared to a flip-chip encapsulation with a similar integration density, the luminous efficiency is increased by nearly 15%, and the cost for manufacturing the light source is reduced by about 40%.

By improving the wire-bonding manner, the present invention reduces the distance of the heat conduction from the fluorescent ceramic sheet to the heat dissipation system, thereby reducing the temperature of the fluorescent ceramic and improving its reliability and luminous efficiency.

Figure 5:
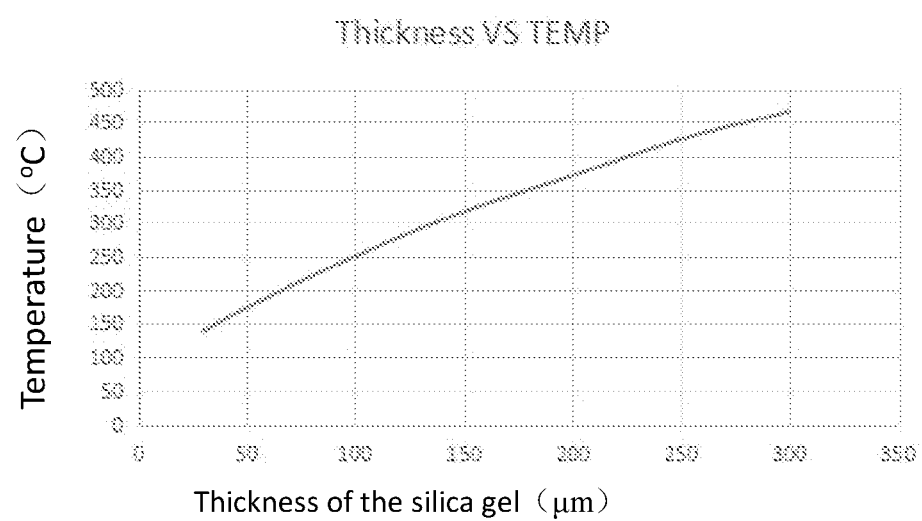
FIG. 5 is a diagram showing the temperature variation curve in the present invention.

The experiment for testing the surface temperature: when the distance to the colloid reduces from 300 μm to 30 μm, the changes in the average temperature on the surface of the phosphor are as shown in the table below, the variation curve is as shown in FIG. 5.

|  | Thickness of the silica gel (μm) | | | | | | |
| --- | --- | --- | --- | --- | --- | --- | --- |
|  | 30 | 50 | 100 | 150 | 200 | 250 | 300 |
| Temperature on the surface of the fluorescent ceramic (° C.) | 138.389 | 174.133 | 250.548 | 316.958 | 370.5 | 424.847 | 466.329 |

Although the specific embodiments of the present invention have been described above, yet it shall be understood by a skilled person who has a knowledge of this technical field that the specific embodiments we describe are just illustrative and are not intended to limit the scope of the present invention, any equivalent modifications and changes made by a skilled person who has a knowledge of this technical field in accordance with the spirit of the present invention shall be included in the protection scope of the claims of the present invention.

The embodiments of the present invention have been specified above. However, the present invention is not limited to the aforementioned embodiments. Any modifications, equivalent substitutions, improvements, and the like that are made within the framework of the spirits and principles of the present invention shall be included in the protection scope of the present invention.

The invention claimed is:

1. A high-density integrated COB white light source, comprising a die-bonding substrate, height limiting retainers disposed on the die-bonding substrate, and a solid-state phosphor located in a light exit direction of the die-bonding substrate, wherein the height limiting retainers support the solid state phosphor, wherein the die-bonding substrate comprises a substrate, and a conductive line layer and array chips provided on the substrate, wherein the conductive line layer includes a chip welding wire region and an external electrode region, which are electrically connected with each other; and that the chip welding wire region is composed of multiple conductive lines;

wherein the central conductive line located in the central position of the chip welding wire region is a straight line section, and is the longest line section; the conductive lines arranged at both sides of the central conductive line are straight line sections at both ends, and arc sections curved outwards in the middle, the farther a conductive line lies away from the central conductive line, the shorter its straight line section is, and the longer its arc section is, wherein the entire chip welding wire region forms a circular area; the array chips are arranged inside the circular area, and are electrically connected with the conductive lines arranged at both sides;

or wherein the conductive lines are straight line sections arranged parallel to one another, wherein the entire chip welding wire region forms a rectangular area; the array chips are arranged inside the rectangular area, and are electrically connected with the conductive lines arranged at both sides.

2. The high-density integrated COB white light source according to claim 1, wherein the circular area is equally divided into four sector areas, two symmetrically distributed areas of arc sections and two symmetrically distributed areas of straight line sections.

3. The high-density integrated COB white light source according to claim 1, wherein the light source further comprises a reflective dam body made of a highly reflecting colloid, wherein the reflective dam body is arranged on the die-bonding substrate at the outer edge of the height-limiting retainers, and its height is not less than that of the height-limiting retainers.

4. The high-density integrated COB white light source according to claim 3, wherein the outer diameter of the solid-state phosphor is not larger than the inner diameter of the reflective dam body.

5. A method for manufacturing a high-density integrated COB white light source, wherein the manufacturing method comprises the steps of: manufacturing a die-bonding substrate, manufacturing height-limiting retainers, electrically connecting welding wires, manufacturing a reflective dam body, pre-curing a filled colloid, and encapsulating a solid-state phosphor;

manufacturing a die-bonding substrate comprising:
11) designing the configuration of the conductive line layer and the array chips; the conductive line layer including a chip welding wire region and an external electrode region, which are electrically connected with each other; the chip welding wire region being composed of multiple conductive lines;
wherein the central conductive line located in the central position of the chip welding wire region is a straight line section, and is the longest line section; the conductive lines arranged at both sides of the central conductive line are straight line sections at both ends, and arc sections curved outwards in the middle, the farther a conductive line lies away from the central conductive line, the shorter its straight line section is, and the longer its arc section is, wherein the entire chip welding wire region forms a circular area, which is equally divided into four sector areas, two symmetrically distributed areas of arc sections and two symmetrically distributed areas of straight line sections;
or wherein the conductive lines are straight line sections arranged parallel to one another, wherein the entire chip welding wire region forms a rectangular area;
12) fabricating the conductive line layer on a heat-sink substrate by a printing process, and at the same time, covering the regions except the conductive line layer with an electrically insulating layer;
13) fixing the array chips in the circular or rectangular area by a die-bonding process, so as to form a die-bonding substrate;
manufacturing height-limiting retainers is to manufacture height-limiting retainers at the periphery of the die-bonding region;
electrically connecting welding wires is to electrically connect the LED chips in the array chips to the corresponding conductive lines in the conductive line layer by means of a reverse looping and wire bonding process and a gold wire welding process;
manufacturing a reflective dam body is to manufacture a reflective dam body at the periphery of the height-limiting retainers;
pre-curing a filled colloid is to fill a space enclosed by the reflective dam body with transparent colloid until the height-limiting retainers are submerged, to discharge gases and perform pre-curing after leveling of the colloid;
encapsulating a solid-state phosphor is to place the solid-state phosphor on the height-limiting retainers inside the reflective dam body, to maintain a light-pressure state and perform a subsequent deep thermal curing.

6. The method for manufacturing a high-density integrated COB white light source according to claim 5, wherein, during the reverse looping and wire bonding and during the gold wire welding, the first welding point is a conductive line, the second welding point is an electrode of the LED chips, and the second welding point is welded by ball welding, and the highest point of the bank of the wire bonding is 20-80 microns higher than the LED chips, but not higher than the height-limiting retainers, the angle between the lead wire of the first welding point and the horizontal direction is in the range of 15°-80°, and the angle between the lead wire of the second welding point and the horizontal direction is in the range of 30°-80°.

7. The method for manufacturing a high-density integrated COB white light source according to claim 5, wherein the pre-curing is performed at a temperature of 60° C. for a duration of 0.5 hour, and that the deep thermal curing is performed firstly at a temperature of 80° C. for 0.5 hour; then at a temperature of 150° C. for 1 hour; and finally at a temperature of 60° C. for 0.5 hour.

8. The method for manufacturing a high-density integrated COB white light source according to claim 5, wherein the outer diameter of the solid-state phosphor is not larger than the inner diameter of the reflective dam body.

9. The high-density integrated COB white light source according to claim 2, wherein a series-parallel logic of the array chips is to be connected at first in parallel and then in series.

10. The high-density integrated COB white light source according to claim 2, wherein the array chips are electrically connected to the conductive lines in the following specific manner: the LED chips in the array chips are electrically connected to the corresponding conductive lines in the conductive line layer by means of a reverse looping and wire bonding process and a gold wire welding process.

11. The high-density integrated COB white light source according to claim 1, wherein the height-limiting retainers are 150-350 microns higher than the die-bonding substrate.

12. The high-density integrated COB white light source according to claim 3, wherein the highly reflecting colloid reflects the radiation lights in the range of 200-1000 nm with a reflectivity of not less than 70%.

13. The high-density integrated COB white light source according to claim 4, wherein a host material of the solid-state phosphor is glass, ceramic, glass-ceramic or heat-resistant hard organism, and the solid-state phosphor has a function of wavelength conversion, being able to absorb excitation lights having a wavelength of 200-600 nm and to emit radiation lights having a wavelength of 400-800 nm.

14. The method for manufacturing a high-density integrated COB white light source according to claim 8, wherein a host material of the solid-state phosphor is glass, ceramic, glass-ceramic or heat-resistant hard organism, and the solid-state phosphor has a function of wavelength conversion, being able to absorb excitation lights having a wavelength of 200-600 nm and emit radiation lights having a wavelength of 400-800 nm.

* * * * *